(12) United States Patent
Schultz et al.

(10) Patent No.: US 11,215,655 B2
(45) Date of Patent: Jan. 4, 2022

(54) CORRECTION OF TRANSMISSION LINE INDUCED PHASE AND AMPLITUDE ERRORS IN REFLECTIVITY MEASUREMENTS

(71) Applicants: John Weber Schultz, Alpharetta, GA (US); Rebecca Schultz, Alpharetta, GA (US); James Maloney, Marietta, GA (US); Kathleen Maloney, Marietta, GA (US)

(72) Inventors: John Weber Schultz, Alpharetta, GA (US); Rebecca Schultz, Alpharetta, GA (US); James Maloney, Marietta, GA (US); Kathleen Maloney, Marietta, GA (US)

(73) Assignee: Compass Technology Group, LLC, Alpharetta, GA (US)

( * ) Notice: Subject to any disclaimer, the term of this patent is extended or adjusted under 35 U.S.C. 154(b) by 1272 days.

(21) Appl. No.: 14/880,589

(22) Filed: Oct. 12, 2015

(65) Prior Publication Data

US 2016/0103197 A1 Apr. 14, 2016

Related U.S. Application Data

(60) Provisional application No. 62/062,948, filed on Oct. 12, 2014.

(51) Int. Cl.
*G01R 27/28* (2006.01)
*G01R 35/00* (2006.01)
(Continued)

(52) U.S. Cl.
CPC ............ *G01R 27/28* (2013.01); *G01R 27/32* (2013.01); *G01R 35/005* (2013.01); *G01N 22/00* (2013.01);
(Continued)

(58) Field of Classification Search
None
See application file for complete search history.

(56) References Cited

U.S. PATENT DOCUMENTS

| 4,813,001 A | * | 3/1989 | Sloane | G01R 27/28 702/110 |
| 4,853,613 A | * | 8/1989 | Sequeira | G01R 35/005 324/601 |

(Continued)

OTHER PUBLICATIONS

"Keysight Technologies Network Analyzer Basics"; http://literature.cdn.keysight.com/litweb/pdf/5965-7917E.pdf; © Keysight Technologies, 2004-2014; Published in USA, Jul. 31, 2014; 5965-7917E. (Year: 2014).*

(Continued)

*Primary Examiner* — Catherine T. Rastovski
*Assistant Examiner* — Leonard S Liang
(74) *Attorney, Agent, or Firm* — Thomas | Horstemeyer, LLP

(57) ABSTRACT

Various examples of methods and systems are disclosed for correction of phase and amplitude errors that occur in transmission lines connecting transmitter/receiver devices to measurement fixtures. In one example, a method is described that includes using time domain processing to determine a phase shift from the measurement fixture that can occur between calibration measurements and measurements of the specimen under test. In another example, a method is described that includes frequency-domain processing of the signals to obtain both phase and amplitude corrections. Including these phase and amplitude corrections in the calibration procedure can reduce or minimize the errors induced in the measurements when the transmission line(s) experience either temperature changes or physical deflections, among other things.

20 Claims, 7 Drawing Sheets

(51) Int. Cl.
*G01R 27/32* (2006.01)
*G01N 22/00* (2006.01)
*G01S 7/40* (2006.01)
*G01R 33/00* (2006.01)
*G01R 31/11* (2006.01)
*G01R 31/319* (2006.01)
*G01R 31/08* (2020.01)
*G01R 23/16* (2006.01)
*G01R 29/10* (2006.01)

(52) U.S. Cl.
CPC .............. *G01R 23/16* (2013.01); *G01R 29/10* (2013.01); *G01R 31/08* (2013.01); *G01R 31/11* (2013.01); *G01R 31/31901* (2013.01); *G01R 33/0035* (2013.01); *G01R 35/00* (2013.01); *G01S 7/40* (2013.01); *G01S 7/4004* (2013.01)

(56) References Cited

U.S. PATENT DOCUMENTS

| | | | | |
|---|---|---|---|---|
| 6,049,219 A * | 4/2000 | Hwang | ............. | G01R 1/06772 324/750.3 |
| 6,369,738 B1 * | 4/2002 | Swanson | ............. | G01R 23/167 341/114 |
| 6,405,147 B1 * | 6/2002 | Fera | ............. | G01R 31/2837 702/108 |
| 6,766,262 B2 * | 7/2004 | Martens | ............. | G01R 23/20 455/423 |
| 6,987,393 B2 * | 1/2006 | Jean | ............. | G01N 22/00 324/644 |
| 7,809,517 B1 * | 10/2010 | Zuckerman | ............. | H03L 7/07 324/537 |
| 7,848,896 B2 * | 12/2010 | Li | ............. | G01H 9/00 702/56 |
| 8,742,768 B1 * | 6/2014 | Pelletier | ............. | G01N 22/04 324/617 |
| 10,001,521 B1 * | 6/2018 | Tsironis | ............. | G01R 1/045 |
| 2003/0031241 A1 * | 2/2003 | Mar | ............. | G01R 23/20 375/224 |
| 2004/0193382 A1 * | 9/2004 | Adamian | ............. | G01R 27/28 702/118 |
| 2005/0030047 A1 * | 2/2005 | Adamian | ............. | G01R 27/28 324/650 |
| 2005/0091015 A1 * | 4/2005 | Adamian | ............. | G06F 17/5036 703/2 |
| 2005/0150278 A1 * | 7/2005 | Troxler | ............. | G01N 22/00 73/78 |
| 2005/0179444 A1 * | 8/2005 | Tiemeijer | ............. | G01R 27/28 324/637 |
| 2005/0264301 A1 * | 12/2005 | Scott | ............. | G01R 27/32 324/638 |
| 2006/0060078 A1 * | 3/2006 | Deller | ............. | F15B 19/005 91/1 |
| 2006/0066289 A1 * | 3/2006 | Tanbakuchi | ............. | G01R 27/28 324/76.19 |
| 2006/0106546 A1 * | 5/2006 | Roberts | ............. | G01N 22/04 702/27 |
| 2006/0155498 A1 * | 7/2006 | Dunsmore | ............. | G01R 27/28 702/107 |
| 2007/0182424 A1 * | 8/2007 | Benedikt | ............. | G01R 27/32 324/637 |
| 2007/0194776 A1 * | 8/2007 | Bossche | ............. | G01R 27/28 324/76.22 |
| 2009/0149173 A1 * | 6/2009 | Tolaio | ............. | H04W 24/06 455/424 |
| 2010/0082023 A1 * | 4/2010 | Brannan | ............. | A61B 18/18 606/33 |
| 2010/0082084 A1 * | 4/2010 | Brannan | ............. | A61B 18/18 607/102 |
| 2010/0121318 A1 * | 5/2010 | Hancock | ............. | A61B 18/18 606/33 |
| 2012/0249165 A1 * | 10/2012 | Mcerlean | ............. | A61B 18/1815 324/642 |
| 2014/0167704 A1 * | 6/2014 | Lafontaine | ............. | G01R 25/00 320/137 |
| 2015/0226683 A1 * | 8/2015 | Feldman | ............. | G01N 27/023 324/640 |
| 2015/0285621 A1 * | 10/2015 | Schultz | ............. | G01B 15/02 702/172 |
| 2016/0084895 A1 * | 3/2016 | Imhof | ............. | G01R 27/28 702/58 |
| 2016/0139194 A1 * | 5/2016 | Cohen | ............. | G01R 31/11 324/533 |
| 2017/0033808 A1 * | 2/2017 | Lomnitz | ............. | H04W 24/00 |

OTHER PUBLICATIONS

"Agilent De-embedding and Embedding S-Parameter Networks Using a Vector Network Analyzer: Application Note 1364-1"; Copyright ©2000 Agilent Technologies. (Year: 2000).*

* cited by examiner

CORRECTION OF TRANSMISSION LINE INDUCED PHASE AND AMPLITUDE ERRORS IN REFLECTIVITY MEASUREMENTS

CROSS REFERENCE TO RELATED APPLICATIONS

This application claims priority to, and the benefit of, U.S. provisional application entitled "METHOD FOR CORRECTING TRANSMISSION LINE INDUCED ERRORS IN REFLECTIVITY MEASUREMENTS" having Ser. No. 62/062,948, filed Oct. 12, 2014, which is hereby incorporated by reference in its entirety.

BACKGROUND

Measuring the radio frequency (RF), microwave or millimeter wave reflectivity of materials or components often utilizes a substantial length of transmission line or cables to connect the microwave source/receiver to the test apparatus. Such cables may be subject to environmental variations (e.g. temperature or pressure) that change the overall phase shift and amplitude attenuation of signals that travel through the cables. Furthermore, some testing requires physical motion of the cable, which is another source of phase and/or amplitude error.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
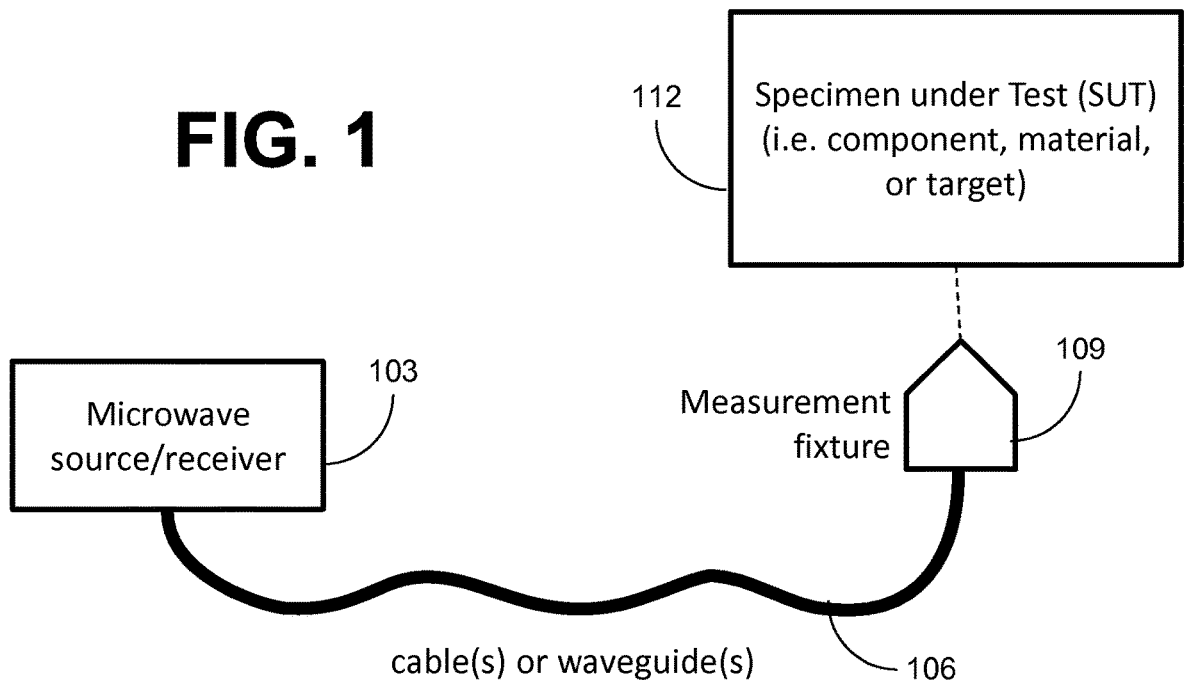
FIG. 1 is a block diagram illustrating an example of a measurement system including a transmitter/receiver, a length of electromagnetic transmission line (e.g., cable or waveguide), and a measurement fixture for evaluating a specimen under test (SUT), in accordance with various embodiments of the present disclosure.

Disclosed herein are various embodiments related to correcting transmission line induced phase and/or amplitude errors in reflectivity measurements. Various examples include methods and systems related to determining and/or correcting for phase and/or amplitude errors that occur in transmission line cables used to connect a transceiver or transmitter/receiver (e.g., a microwave source/receiver) to a measurement device. Reference will now be made in detail to the description of the embodiments as illustrated in the drawings, wherein like reference numbers indicate like parts throughout the several views.

Transmission line cables are commonly used to connect different microwave components together and, in a measurement system, a cable or waveguide can be used to connect a microwave source/receiver to a measurement fixture or sensor. Such cables can be subjected to environmental variations (e.g., temperature or pressure) and/or physical motion that can change the overall phase shift and/or amplitude attenuation of the cable, which can result in phase and/or amplitude errors in the signals transmitted through the cable. When possible, great care is often taken to design a test apparatus or methodology to minimize movement of the test cables so that these position-induced errors are minimized. However, in some measurement scenarios, such as those that use physically scanned sensors or antennas, position-induced phase errors may not be avoided. Additionally, temperature variations that change the cable phase and/or amplitude response may be unavoidable in some situations.

This problem of cable-induced phase errors has been a concern for many different applications. The phase variation of a long cable may be compensated by terminating the cable with appropriate microwave circuitry. A controlled reflection can be provided and measured with a phase measurement circuit at the source, and then subsequent motorized cable stretching can be used to compensate for said error. Similarly, a test head that is used to locally mix radio frequency (RF) signals at the test location can experience phase errors. For example, even an intermediate frequency (IF) signal that is transmitted to a microwave network analyzer over a length of cable that experiences movement can experience phase errors. In this case, subsequent measurement of a separate phase stable reflection reference and comparison to the device under test may be used to compensate for the phase errors induced by the cable.

Unlike previous systems that attempt to address cable phase errors, the present disclosure does not utilize any specialized circuitry at the measurement fixture. Instead it utilizes in-situ reflections that exist in the measurement fixture to obtain a reflection reference signal. Additionally, the disclosed correction method combines these fixture reflections with frequency and time-domain signal processing to compensate for erroneous phase and amplitude shifts that occur during a measurement procedure.

Referring to FIG. 1, shown is an example of a measurement system including a transmitter/receiver (or transceiver) 103 such as, e.g., a microwave transmitter/receiver, a length of electromagnetic transmission line 106, a measurement fixture 109, and a specimen under test (SUT) 112. Transmission lines 106 include, but are not limited to, coaxial cables, striplines, waveguides, microstrips, coplanar lines, or another appropriate transmission structure. The measurement fixture 109 can transmit a signal that can interact with a component, material, device under test, or target under test, which can also be referred to as a "specimen under test" or SUT 112. Signals used to excite the measurement fixture 109 and reflected signals received from the measurement fixture 109 can be transported to and from the microwave source/receiver 103 via the transmission line or cable 106. For example, a radar cross-section range measures electromagnetic scatter from a target 112 with a radar system connected to an exciting antenna via a coaxial cable or a waveguide 106. The antenna can be used, often in conjunction with other beam forming elements, to illuminate the target 112 with the transmitted signal.

The energy reflected from the target 112 can be received by the measurement fixture 109 and communicated back to the receiver (or transceiver) 103 of the radar system via the connected cable or waveguide 106. Reflected signals from the target under test 112 and from one or more calibration targets can be determined with the radar system or with a network analyzer. In other embodiments, a materials measurement apparatus can comprise a microwave network analyzer 103, connected to an antenna or probe 109 by a cable 106. The antenna or probe 109 can be used to illuminate or excite a material specimen 112 and to receive the reflected energy from that material specimen 112, which in turn can be transmitted back to the network analyzer 103 via the same cable 106. The various reflected signals from calibration and from the specimen under test 112 can be recorded from the network analyzer 103, which may be computer controlled.

Figure 2:
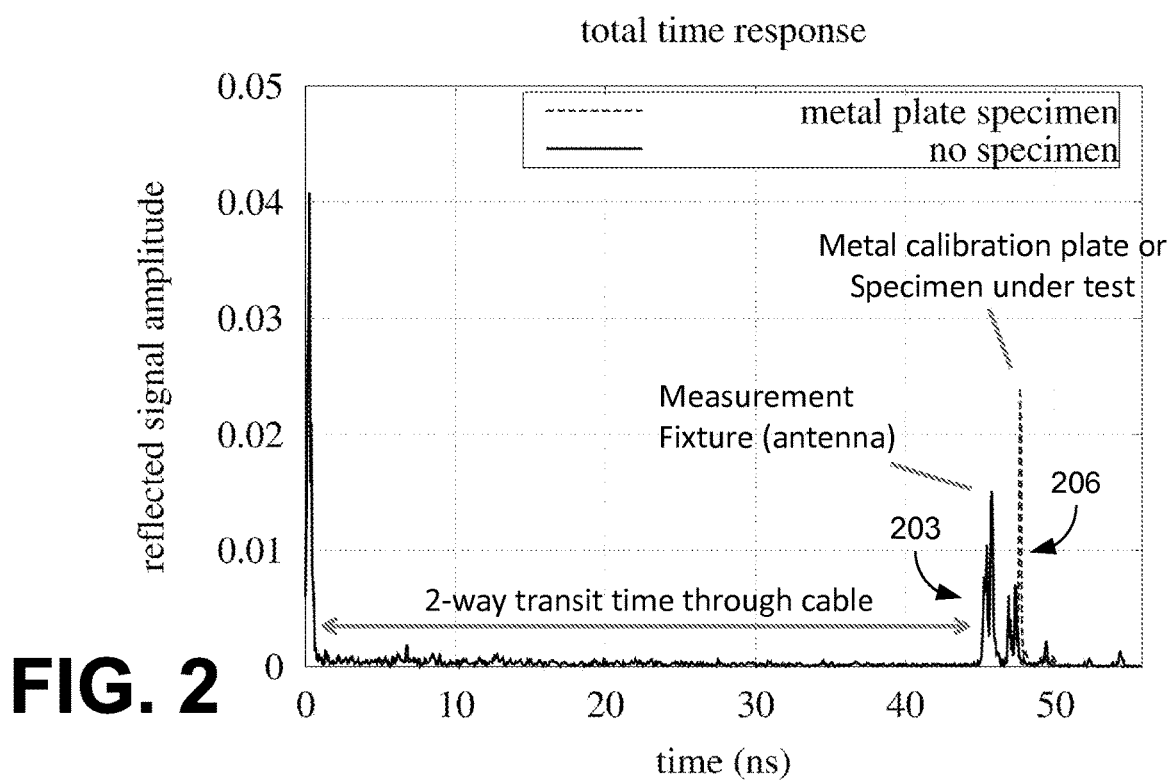
FIG. 2 shows an example of time domain signals illustrating reflection responses of the measurement fixture of FIG. 1 with no specimen and with a metal plate, in accordance with various embodiments of the present disclosure.

Referring now to FIG. 2, shown is an example of the reflected signals measured with one such material measurement apparatus. In this example, a microwave network analyzer 103 excites the apparatus at a series of frequencies that are stepped from 2 to 18 GHz. The apparatus includes an approximately 4.5 meter coaxial cable 106 that connects the network analyzer 103 to a near field probe 109 (FIG. 1), which in turn illuminates the material specimen 112 (FIG. 1). The reflections from that specimen 112 are received by the probe 109 and measured by the network analyzer 103.

The data shown in FIG. 2 illustrates what occurs after the reflected signals at the series of frequencies have been mathematically transformed from the frequency domain to the time domain, and includes a reflection response of the measurement fixture 109 with no specimen. The reflection response occurs at a time determined primarily by the length of cable 106 between the microwave source/receiver 103 and measurement fixture 109. Also shown in FIG. 2 is a reflection response of a metal plate as a calibration specimen, which includes the measurement fixture response and another primary peak from the metal plate that is later in time. While not specifically shown in FIG. 2, a specimen reflection signal would occur at approximately the same time as the metal plate signal (or approximately the same location in the time domain plot).

The reflections received by the probe 109 are evident as peaks in the time-domain signal of FIG. 2. As the first peak 203 in the data indicates, the round-trip time for the signal to travel from the port of the network analyzer 103 to the probe 109 (FIG. 1) and back is approximately 45 nanoseconds. In this example, there is a second peak 206 that is evident approximately two nanoseconds after the probe reflection peak 203, and the time of this second peak 206 represents the round-trip time for the primary reflection from the calibration specimen or from a specimen under test 112 (FIG. 1).

The measured signals can include both foreground signals and background signals. Foreground signals are unwanted reflections that occur before the signal of interest, and background signals are unwanted reflections that occur after the signal of interest. If these foreground and background signals are not properly subtracted, they then impact the desired signal in the frequency domain. In this example, the reflection of the measurement fixture (probe antenna) 112 is an unwanted foreground signal. As FIG. 2 illustrates, reflections from the probe 109 may be immediately adjacent to or even overlap the specimen under test 112.

In the calibration process, vector-subtraction can be used to remove foreground or background signals from the signal of interest. The vector subtraction can be done for both the measurement of calibration standards and the measurement of the specimen under test 112. However if the ambient temperature changes, then thermal expansion can cause the length of the cable 106 (FIG. 1) to change in between calibration measurement and specimen measurement. This can impose an erroneous phase shift that is different for the specimen measurement than it is for the calibration measurement(s). Similarly, if the cable 106 is physically moved or disturbed during the specimen measurement, then that cable displacement can also impose a significant phase and/or amplitude change that degrades the quality of the background/foreground subtraction. In FIG. 2, this phase shift would be represented by an increase or decrease in the 2-way transit time through the cable 106 to the measurement fixture 109. Under this condition, the measurement fixture response 203 would shift and the vector-subtraction of that fixture response 203 would have an error.

Figure 3:
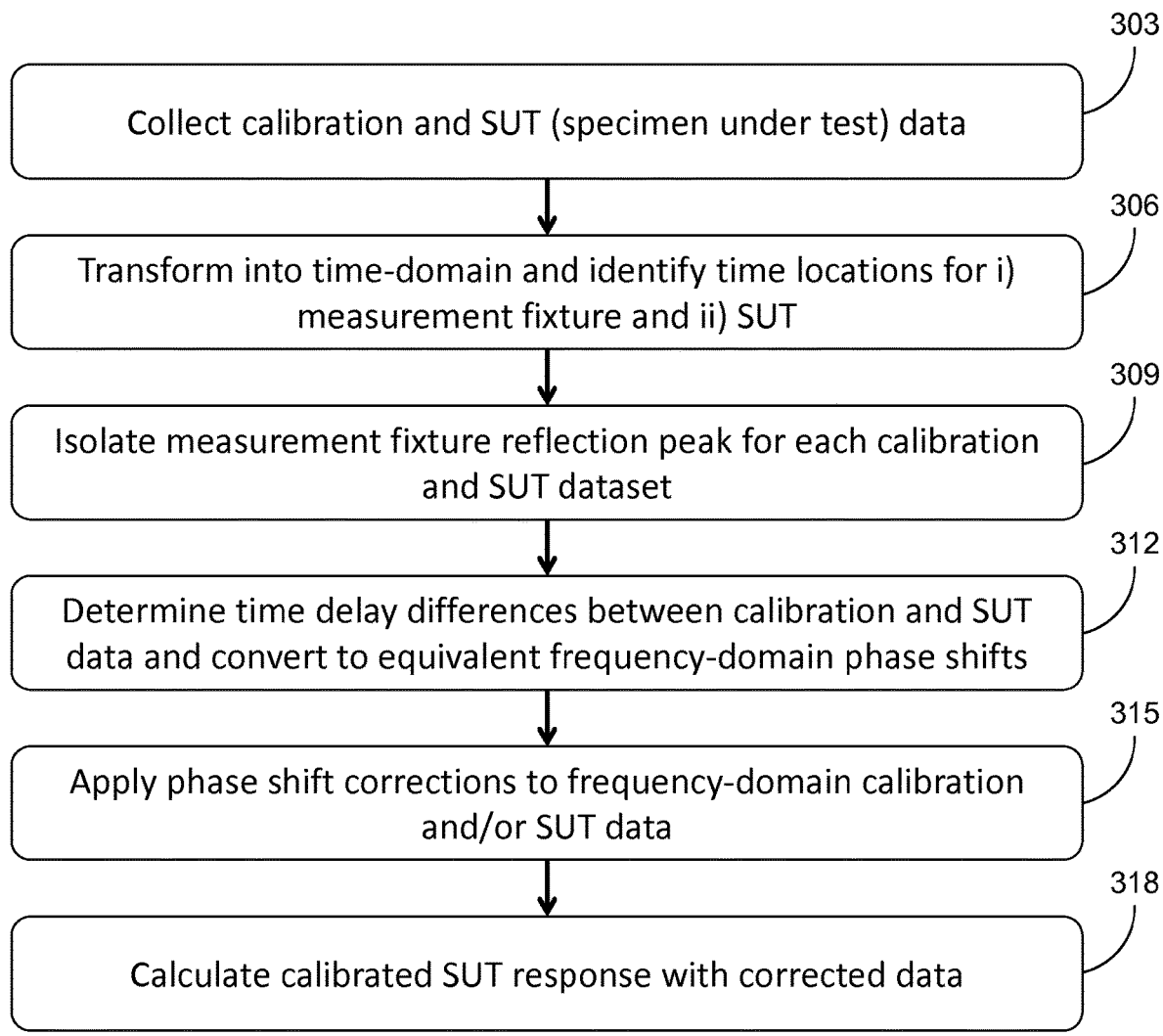
FIG. 3 shows a flow chart illustrating an example of correction of transmission line induced phase errors, in accordance with various embodiments of the present disclosure.

Referring next to FIG. 3, shown is a flow chart illustrating an example of the disclosed correction method for addressing the errors caused by these cable phase and/or amplitude changes. Beginning at 303, calibration and SUT measurement data can be collected. As previously discussed, this can be accomplished using a microwave measurement system that steps through a series of frequencies. The measurement data can be transformed from the frequency domain into the time domain via a Fourier transform at 306, and the time domain information can be used to identify the time locations for the measurement fixture 109 and the SUT 112 (FIG. 1). This is partially illustrated in FIG. 2, where the time domain calibration measurement of a known reference material (e.g., a reflective metal plate) and a second time domain reference measurement with no specimen (free space) are shown.

By comparing the time-domain signals with and without a calibration or unknown specimen under test, it is possible to discern the reflections caused by just the measurement fixture 109 (FIG. 1) of the measurement system. For calibration, the reflections of the measurement fixture 109 are subtracted from the known reference measurement, as well as from subsequent measurements of unknown specimens. However, when environmental or physical changes in the cable 106 cause the measurement fixture reflections to occur at a slightly different time, the unwanted parts of the signal are not properly subtracted.

In the frequency domain, this time shift is equivalent to a frequency-dependent phase error that degrades the vector subtraction of the foreground or background (i.e., the probe reflections in this example) from the unknown specimen under test. The time domain signals can be used to determine the exact location of the measurement fixture reflections in time so that they can be monitored during subsequent data collections. At 309, the measurement fixture reflection peak for each calibration and SUT dataset can be isolated.

Figure 4:
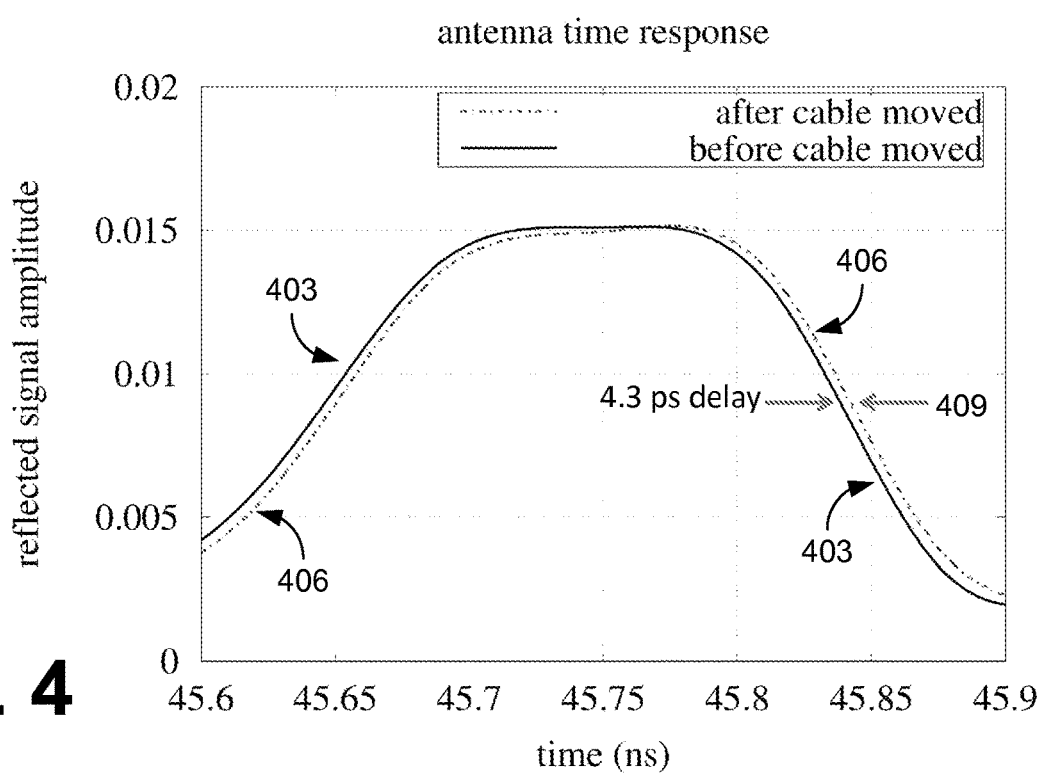
FIG. 4 shows a portion of the time domain response of a measurement fixture before and after the transmission line was physically disturbed to illustrate an example of the time delay resulting from the movement, in accordance with various embodiments of the present disclosure.

At 312, the time delay differences between the calibration and SUT data is determined and converted to equivalent frequency-domain phase shifts. For example, the time delay and/or phase error imposed by environmental effects or motion of a cable can be determined by iterative fitting or by calculation of the relevant phase slopes. FIG. 4 illustrates an example of the time delay 409 that may occur when the cable 106 (FIG. 1) is physically disturbed. Two instances of the reflected signal from a measurement fixture are shown: a first signal 403 before the cable 106 was moved and a second signal 406 after the cable 106 was moved. As these data show, the cable motion imposed an additional time delay of 4.3 picoseconds between the first measurement 403 and the second measurement 406.

At 2 GHz, this time delay 409 corresponds to approximately 3 degrees of phase error while at 18 GHz, the same time delay 409 is approximately equivalent to 28 degrees of phase error. Note that identifying this delay 409 can be done by comparing an appropriate time window of the two signals. For example, an algorithm implemented on a computing device can be used to subtract the two signals while iteratively shifting one of them in time relative to the other. The minimum subtracted value occurs when the shifted signal exactly overlaps the other signal in time, and this corresponds to the time delay 409. Note that other mathematical methods may also be used to determine this delay 409 between the two signals.

Referring back to FIG. 3, phase shift correction can be applied to calibration and/or SUT data at 315. Knowledge of the phase error or time delay differences can be used to apply the phase correction. This operation can be carried out in either the time domain or the frequency domain as they are mathematically equivalent. In the frequency domain, the phase correction can be applied by multiplying the signal-to-be-corrected, S, with the exponential function of radial frequency (w) times the time delay (t), which is multiplied by the square root of negative one, or:

$$S^{corrected} = S^{uncorrected} e^{-i\omega t} \quad (1)$$

The calibrated SUT response, $S^{calibrated}$ can be calculated with the corrected data at 318, as discussed below.

Figure 5:
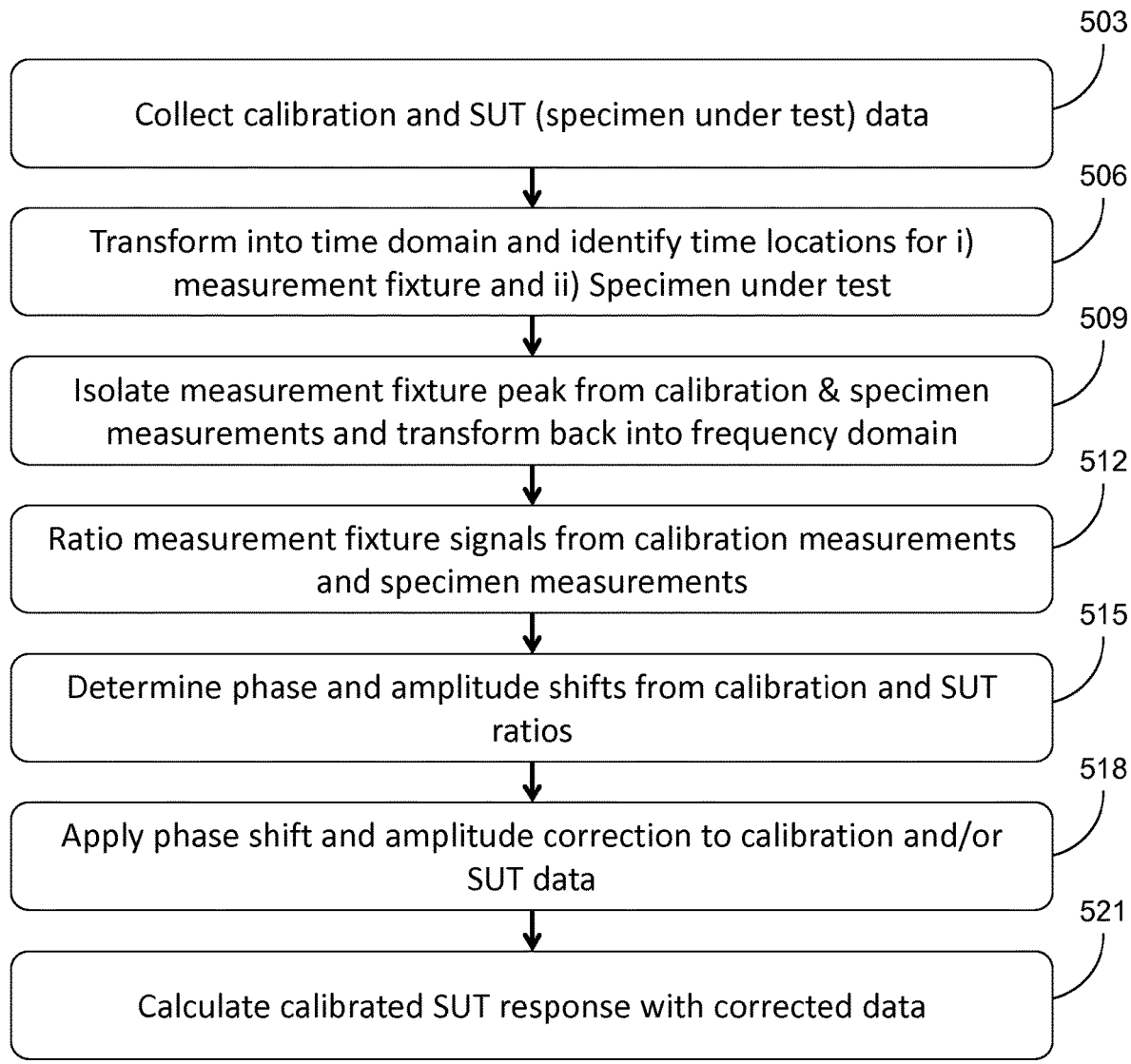
FIG. 5 shows a flow chart illustrating an example of correction of transmission line induced phase and amplitude errors, in accordance with various embodiments of the present disclosure.

Another example of correcting the measured signals is illustrated in the flow chart of FIG. 5. This example differs from FIG. 3 in that the phase offsets are determined after the signal from the measurement fixture is transformed back into frequency domain again. Beginning at 503, calibration and SUT measurement data can be collected and the measurement data transformed from the frequency domain into the time domain via a Fourier transform at 506 for identification of the time locations for the measurement fixture 109 and the SUT 112 (FIG. 1). At 509, the measurement fixture reflection peak for each calibration and SUT dataset can be isolated. For example, the measurement fixture reflection peak can be isolated using time domain gating. In the frequency domain, the ratio of two measurement fixture signals can be used to determine the phase shift and/or amplitude shift between the two signals.

In FIG. 5, the measurement fixture signals from the calibration measurements and specimen measurements are ratioed at 512 and the phase shift and/or amplitude shift determined from the calibration and SUT ratios at 515. That phase shift, θ(f), can be fitted to a straight line that can then be used to determine a frequency-domain correction factor. Additionally, it is possible for cable motion to result in a small amplitude error. The mean of the absolute value of the amplitude ratio between the two signals, α can thus be calculated. The signal of interest (calibration and/or SUT data) can then be corrected at 518 by multiplying it in frequency domain by a combination of the amplitude and/or phase shift correction factors, as given by:

$$S^{corrected} = S^{uncorrected} \alpha e^{i\theta}. \quad (2)$$

At 521, the calibrated SUT response, $S^{calibrated}$, can be calculated with the corrected data, as discussed below.

Figure 6:
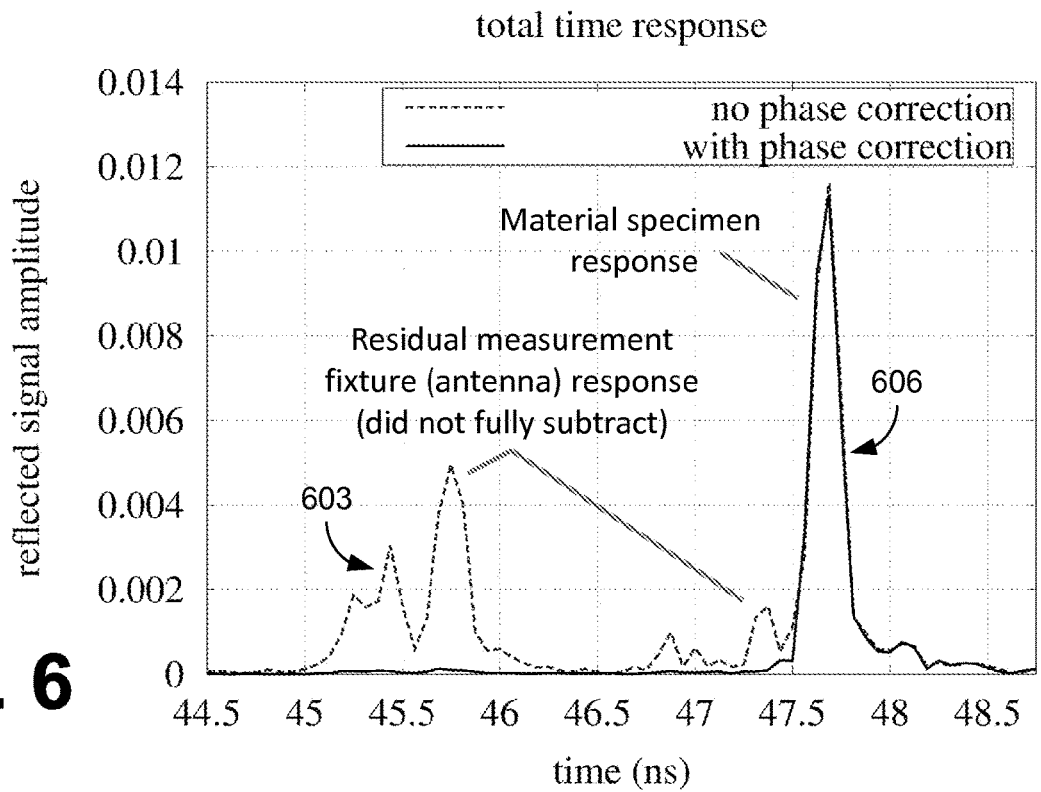
FIG. 6 shows a portion of the time domain signals of a measurement after vector subtraction of the isolation calibration measurement, with and without a phase correction applied, in accordance with various embodiments of the present disclosure.

FIG. 6 shows the result of vector subtractions of the foreground and/or background signal(s) from a measurement signal of a material specimen 112 (FIG. 1). The dotted line 603 shows the vector subtraction done without correcting for the extra time delay imposed by the cable motion. This is the traditional calibration procedure applied to measurements of this type. The solid curve 606 shows the same subtraction done after the material specimen measurement was corrected for the 4.3 picosecond phase delay 409 shown in FIG. 4. These data show that without the proper phase correction, the measurement fixture reflections may not be fully subtracted thereby increasing the measurement errors. Thus, the disclosed phase and amplitude correction method significantly improves measurement accuracy by more fully eliminating measurement fixture artifacts.

Figure 7:
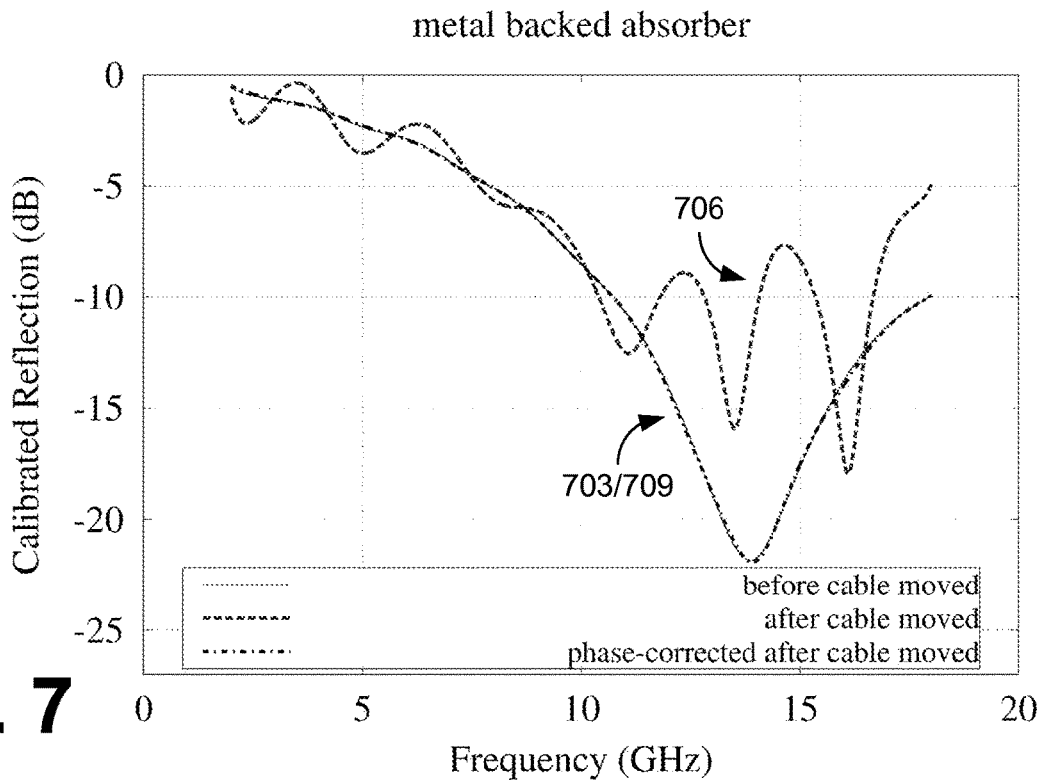
FIG. 7 shows the calibrated reflection data from a measurement of a metal-backed microwave absorber, in accordance with various embodiments of the present disclosure.

The final step 318 and 521 of the disclosed correction methods of FIGS. 3 and 5, respectively, applies a calibration calculation to the measured data, which also includes the appropriate phase corrections. FIG. 7 shows an example of a fully calibrated reflection measurement of an absorber material backed by a conductive sheet. Three different calibrated curves are shown in FIG. 7. Without the phase correction, there is anomalous measurement ripple in the frequency response 706. However, the phase corrected data 709 shows a single absorption null, which closely matches the data 703 that was measured when the cable is not disturbed.

All the data were calibrated using a "response and isolation" methodology. The response measurement is of an ideal microwave reflector (or other calibration standard), in this case a flat metal plate, while the isolation measurement is of no specimen (free space). The calibration procedure first vector-subtracts the isolation measurement from both the response measurement and from the measurement of the specimen under test 112 (FIG. 1). When the disclosed correction method is used, the phase and/or amplitude correction can be applied at each vector subtraction step. In other words, the isolation measurement is vector subtracted from the corrected specimen under test data, and the isolation measurement is also vector subtracted from the corrected response data. The final calibrated reflectivity, $S^{calibrated}$ of the specimen is then the ratio of the subtracted specimen data to the subtracted response data, or:

$$S^{calibrated} = \frac{S^{corrected}_{specimen} - S_{isolation}}{S^{corrected}_{response} - S_{isolation}}. \quad (3)$$

Note that while the disclosed phase correction method is demonstrated on a "response and isolation" calibration procedure, it could be applied to other calibration methods as well.

The thin solid line 703 of FIG. 7 shows the calibrated measurement, where care was taken to not move the RF cable 106 (FIG. 1) between the calibration measurements and the specimen measurement. In this measurement example, a network analyzer 103 (FIG. 1) was used along with a microwave spot probe 109 (FIG. 1) that was held in close proximity to the specimen under test 112 (FIG. 1). The spot probe 109 illuminated a small area of the specimen 112, providing a localized measurement of the material reflectivity. The dashed line 706 shows the same specimen measured after the RF cable 106 that connected the network analyzer 103 to the spot probe 109 was moved, but without any phase correction. The dash-dot line 709 shows the specimen measurement after the cable 106 was moved but when a phase and amplitude correction is made by applying the disclosed method. The corrected data after cable movement almost completely overlays the calibrated data for when the cable 106 was not disturbed. As these data show, cable movement can significantly degrade the accuracy of an RF measurement, but the disclosed correction method can almost fully account for these errors.

Figure 8:
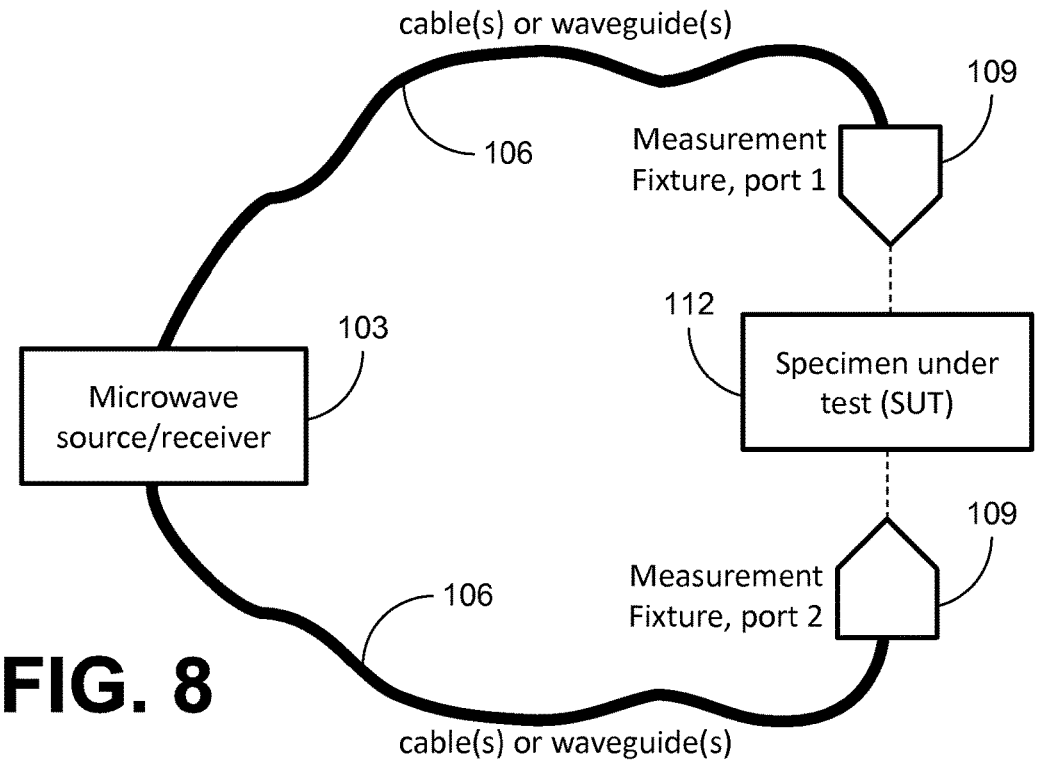
FIG. 8 is a block diagram illustrating an example of a two-port measurement system including a transmitter/receiver, a measurement fixture with multiple ports for evaluating a SUT, and lengths of electromagnetic transmission line (e.g., cable or waveguide) going to each port, in accordance with various embodiments of the present disclosure.

The disclosed phase correction method may also be applied to multi-port measurement fixtures. Referring to FIG. 8, shown is an example of a two-port measurement system in which two measurement fixtures or devices 109 are used to characterize an unknown specimen 112. For example, in a free space material measurement fixture, two antennas 109 can be placed on either side of a planar specimen 112, and both reflection and transmission can be collected at the same time. Just as the reflection data may suffer from cable-induced phase errors, so can transmission data. Recall that the disclosed correction method applied to reflection depends on a reference reflection signal from the measurement fixture 109 to establish a phase reference. This reference reflection does not exist in the transmission data. However, if transmission is measured at or close to the same time as the reflection, then the reflection corrections can be used to also correct for the transmission phase errors. In particular, the above-described correction methods can determine the two-way phase errors for each port independently. To obtain the transmission phase error between two ports, the one-way phase error of each port (i.e., half of the two-way phase error) may be added. In the time domain, this is equivalent to adding the one-way time delays of each port. In the case of transmission, the delay of interest is between the measurement of the specimen 112 and the measurement of no specimen.

Figure 9:
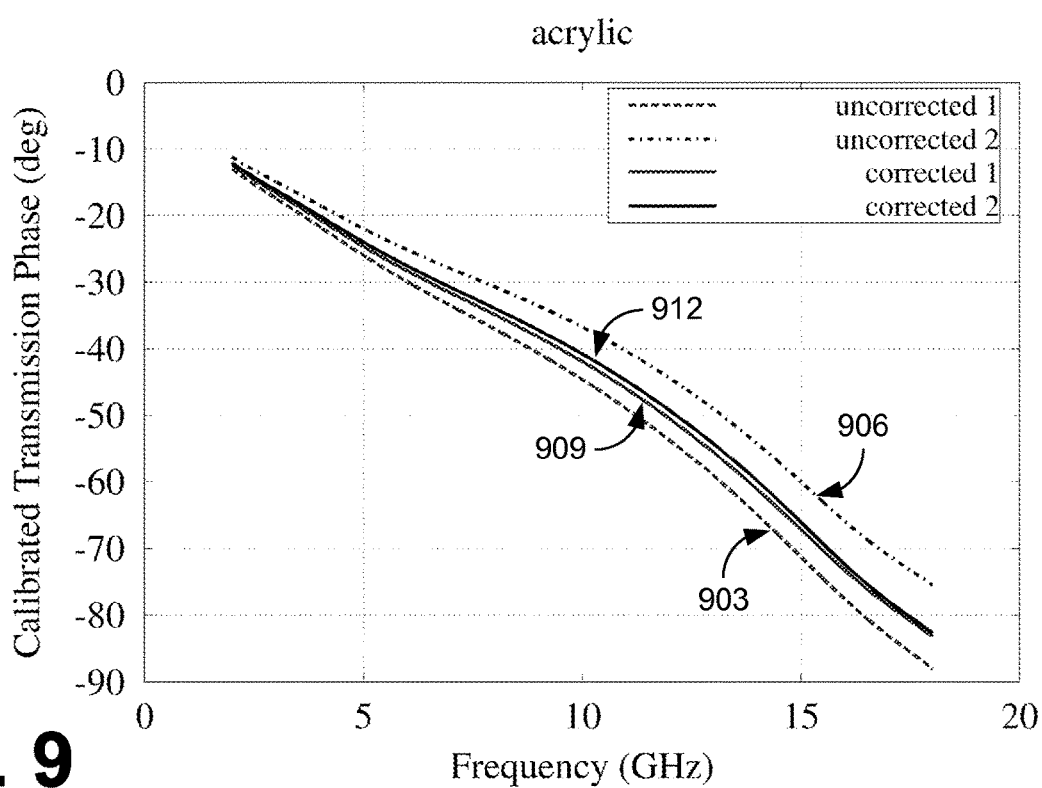
FIG. 9 shows an example of plotted transmission coefficient phase from the two-port measurement fixture of FIG. 8 with an acrylic specimen, in accordance with various embodiments of the present disclosure.

Referring to FIG. 9, shown is an example of the plotted transmission coefficient phase from a two-port measurement fixture 109 with a 0.25" thick acrylic specimen inserted. Two sets of data were measured and the cables 106 were physically moved in between the calibration measurement and the specimen measurements. The cables 106 were twisted in different orientations for the two specimen measurements, thus inducing different phase errors. An example where the single-port reflection phase errors in each direction are added to correct the two-port transmission is shown in FIG. 9. The dashed line 903 and dash-dotted line 906 show the transmission phase measured by a system comprising two microwave probes 109 on either side of the acrylic material specimen 112. The lines 903 and 906 show data that has been calibrated but not phase corrected. A calibration measurement was made with no specimen, and then the material specimen was inserted between the probes 109 for subsequent measurements. The data shown in FIG. 9 includes the ratio of the specimen measurement data to the calibration measurement data. The cables 106 connecting the probes 109 to a network analyzer 103 were physically moved in between the calibration and each of the specimen measurements, inducing a frequency dependent phase change as seen by the difference between the uncorrected curves 903 and 906. Two measurements were made with the cable 106 twisted in different ways to induce different phase errors. Except for the cable-induced errors, these curves are supposed to overlay since they are measurements of the same specimen.

With the phase correction method described above, the single port reflections were used to determine the delay 409 (FIG. 4) from these cable movements in time-domain. The calibration of the transmission data was then accomplished by dividing the transmission through the specimen under test 112 by the transmission through the same fixture 109, but with no specimen inserted. The phase correction can be applied by multiplying this calibrated transmission signal by the exponential function of radial frequency multiplied by the calculated phase delay times the square root of negative one, as given by equation (1). Applying the disclosed multi-port (transmission) phase corrections to the measurement data results in the solid curves 909 and 912 in FIG. 8. As the data shows, this phase correction significantly reduces the phase errors from the cables 106 and the two corrected measurements 909 and 912 now almost overlay as they should. Thus the correction methods disclosed here may be applied to both reflection and transmission data in multi-port measurement fixtures.

Figure 10:
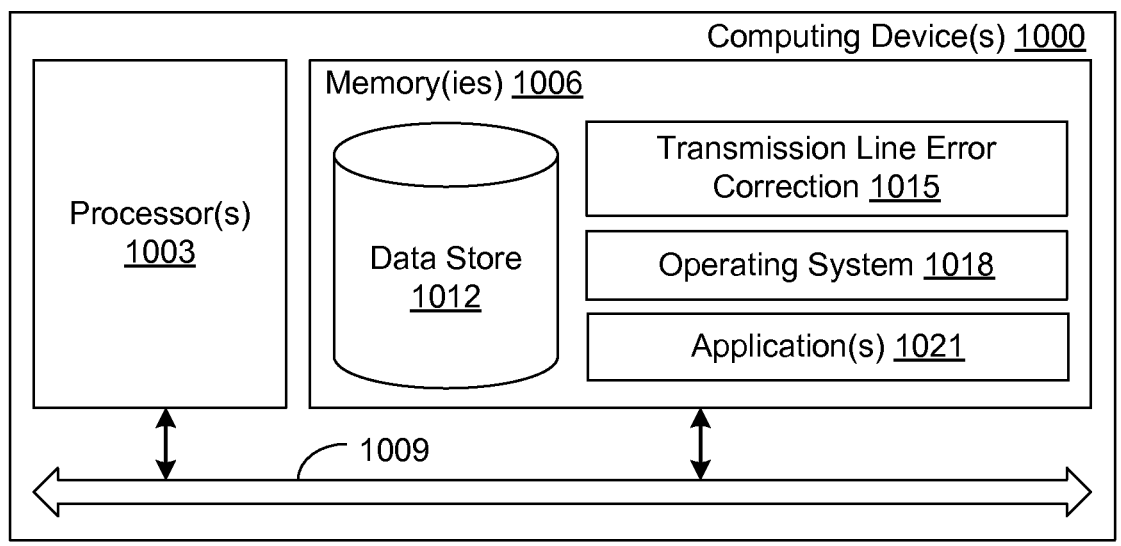
FIG. 10 is a schematic block diagram illustrating an example of a computing device that can be used for transmission line error correction, in accordance with various embodiments of the present disclosure.

With reference to FIG. 10, shown is a schematic block diagram of a computing device 1000 according to various embodiments of the present disclosure. The computing device 1000 includes at least one processor circuit, for example, having a processor 1003 and a memory 1006, both of which are coupled to a local interface 1009. To this end, the computing device 1000 may comprise, for example, at least one server computer or like device. The local interface 1009 may comprise, for example, a data bus with an accompanying address/control bus or other bus structure as can be appreciated.

Stored in the memory 1006 are both data and several components that are executable by the processor 1003. In particular, stored in the memory 1006 and executable by the processor 1003 are a transmission line error correction application 1015, an operating system 1018, and/or other applications 1021. Also stored in the memory 1006 may be a data store 1012 and other data. In addition, an operating system may be stored in the memory 1006 and executable by the processor 1003.

It is understood that there may be other applications that are stored in the memory 1006 and are executable by the processor 1003 as can be appreciated. Where any component discussed herein is implemented in the form of software, any one of a number of programming languages may be employed such as, for example, C, C++, C#, Objective C, Java®, JavaScript®, Perl, PHP, Visual Basic®, Python®, Ruby, Delphi®, Flash®, or other programming languages.

A number of software components are stored in the memory 1006 and are executable by the processor 1003. In this respect, the term "executable" means a program file that is in a form that can ultimately be run by the processor 1003. Examples of executable programs may be, for example, a compiled program that can be translated into machine code in a format that can be loaded into a random access portion of the memory 1006 and run by the processor 1003, source code that may be expressed in proper format such as object code that is capable of being loaded into a random access portion of the memory 1006 and executed by the processor 1003, or source code that may be interpreted by another executable program to generate instructions in a random access portion of the memory 1006 to be executed by the processor 1003, etc. An executable program may be stored in any portion or component of the memory 1006 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 1006 is defined herein as including both volatile and nonvolatile memory and data storage components. Volatile components are those that do not retain data values upon loss of power. Nonvolatile components are those that retain data upon a loss of power. Thus, the memory 1006 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 1003 may represent multiple processors 1003 and the memory 1006 may represent multiple memories 1006 that operate in parallel processing circuits, respectively. In such a case, the local interface 1009 may be an appropriate network that facilitates communication between any two of the multiple processors 1003, between any processor 1003 and any of the memories 1006, or between any two of the memories 1006, etc. The local interface 1009 may comprise additional systems designed to coordinate this communication, including, for example, performing load balancing. The processor 1003 may be of electrical or of some other available construction.

Although the data capture application 1015, the data analysis application 1018, application(s) 1021, and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

The flowcharts of FIGS. 3 and 5 show functionality and operation of an implementation of portions of the transmission line error correction application 1015. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 1003 in a computer system or other system. The machine code may be converted from the source code, etc. If embodied in hardware, each block may represent a circuit or a number of interconnected circuits to implement the specified logical function(s).

Although the flowcharts of FIGS. 3 and 5 show a specific order of execution, it is understood that the order of execution may differ from that which is depicted. For example, the order of execution of two or more blocks may be scrambled relative to the order shown. Also, two or more blocks shown in succession in FIGS. 3 and 5 may be executed concurrently or with partial concurrence. Further, in some embodiments, one or more of the blocks shown in FIGS. 3 and 5 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including the transmission line application 1015 and/or application(s) 1021, that comprises software or code can be embodied in any non-transitory computer-readable medium for use by or in connection with an instruction execution system such as, for example, a processor 1003 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

In one embodiment, among others, a method for correcting transmission line induced phase errors (e.g., in microwave and millimeter wave measurements), where a source/receiver 103 (FIG. 1) is connected to a measurement fixture 109 (FIG. 1) via a transmission line 106 (FIG. 1), includes collection of frequency dependent data of both calibration standards and of one or more devices or material specimens under test (SUT); transformation of said frequency data into time domain and identification of time locations of relevant reflections from the measurement fixture and from the SUT;

determination of the SUT-to-calibration time delays, phase changes and/or amplitude changes of the measurement fixture reflections of said measurements; application of phase and/or amplitude corrections to said measurements based on the observed time delays, phase changes and/or amplitude changes. The phase and/or amplitude corrected data can be used in the calibration procedure.

In another embodiment, a method for correcting transmission line induced phase errors, where a source/receiver 103 (FIG. 8) is connected to a measurement fixture 109 with two or more ports (FIG. 8) via transmission lines 106 (FIG. 8), includes utilization of the phase correction on each port of the measurement fixture to determine one-way phase delays, phase changes and/or amplitude changes for each port; addition of the determined one-way phase delays, phase changes and/or amplitude changes for each coupled port pair; and application of phase and/or amplitude corrections to the transmitted signals for each port pair. The phase and/or amplitude corrected data can be used in the calibration procedure.

In various aspects of these embodiments, the phase errors can be induced by temperature changes and/or physical motion of the transmission line. The transmission line can be a coaxial cable, a stripline, a waveguide, a microstrip, a coplanar line, or another appropriate transmission system. The determination of the SUT-to-calibration time delay or phase change can be accomplished by iterative fitting or by calculation of the relevant phase slopes. The transmission phase correction method can be applied to the measurement of material properties. The transmission phase correction method can be applied to electromagnetic scatter from targets or components.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

The invention claimed is:

1. A method for correction of transmission line induced errors, the method comprising:

collecting frequency dependent reflection data of a specimen under test (SUT) via a transmission line coupled to a measurement fixture;

transforming the frequency dependent reflection data of the SUT to corresponding time domain reflection data of the SUT;

isolating reflection peak data of the measurement fixture in the time domain reflection data of the SUT;

transforming the isolated reflection peak data of the measurement fixture to corresponding frequency domain reflection data of the measurement fixture;

determining SUT-reference ratios between the frequency dependent reflection data of the SUT and the frequency domain reflection data of the measurement fixture; and applying a phase shift correction to the frequency dependent reflection data of the SUT to generate corrected SUT reflection data, the phase shift correction based upon the SUT-reference ratios.

2. The method of claim 1, further comprising:

determining a calibration time delay between a time location of a reflection from the measurement fixture in time domain reflection data of a calibration standard and a time location of a reflection from the measurement fixture in time domain reflection data of a reflection reference; and applying a phase shift correction to frequency dependent reflection data of the calibration standard to generate corrected calibration standard reflection data, the phase shift correction based upon the calibration time delay.

3. The method of claim 2, further comprising:

collecting frequency dependent reflection data of the reflection reference via the transmission line coupled to the measurement fixture;

transforming the frequency dependent reflection data of the reflection reference to the time domain reflection data of the reflection reference; and identifying the time location of the reflection from the measurement fixture based on the time domain reflection data of the reflection reference.

4. The method of claim 3, wherein the reflection reference is free space without a calibration standard or SUT.

5. The method of claim 3, wherein the frequency dependent reflection data of the reflection reference is collected at a plurality of excitation frequencies within a predefined range of frequencies.

6. The method of claim 2, further comprising:

collecting the frequency dependent reflection data of the calibration standard via the transmission line coupled to the measurement fixture;

transforming the frequency dependent reflection data of the calibration standard to the time domain reflection data of the calibration standard; and identifying the time location of the reflection from the measurement fixture based on the time domain reflection data of the calibration standard.

7. The method of claim 6, wherein the frequency dependent reflection data of the calibration standard is collected at a plurality of excitation frequencies within a predefined range of frequencies.

8. The method of claim 2, further comprising determining a calibrated SUT response based at least in part upon the corrected SUT reflection data and the corrected calibration standard reflection data.

9. The method of claim 8, wherein the calibrated SUT response is further based upon isolation reflection data collected via the transmission line coupled to the measurement fixture.

10. The method of claim 9, further comprising:
collecting frequency dependent reflection data of free space without a calibration standard or SUT via the transmission line coupled to the measurement fixture; and
transforming the frequency dependent reflection data of free space to the isolation reflection data.

11. The method of claim 10, wherein the frequency dependent reflection data of free space is collected at a plurality of excitation frequencies within a predefined range of frequencies.

12. The method of claim 1, wherein the frequency dependent reflection data of the SUT is collected at a plurality of excitation frequencies within a predefined range of frequencies.

13. The method of claim 12, wherein a network analyzer sequentially provides the plurality of excitation frequencies and collects the frequency dependent reflection data of the SUT at each of the plurality of excitation frequencies via the transmission line coupled to the measurement fixture.

14. The method of claim 1, wherein the transmission line comprises a coaxial cable, a stripline, a waveguide, a microstrip, or a coplanar line.

15. The method of claim 1, wherein the phase shift correction comprises an amplitude correction.

16. The method of claim 1, further comprising determining a calibrated SUT response based at least in part upon the corrected SUT reflection data.

17. The method of claim 1, further comprising:
collecting frequency dependent reflection data of a reflection reference via the transmission line coupled to the measurement fixture; and
transforming the frequency dependent reflection data of the reflection reference to time domain reflection data of the reflection reference.

18. The method of claim 17, wherein the reflection reference is a calibration standard.

19. The method of claim 17, wherein the reflection reference is free space without a calibration standard or SUT.

20. The method of claim 17, wherein the frequency dependent reflection data of the reflection reference is collected at a plurality of excitation frequencies within a predefined range of frequencies.

* * * * *